(12) United States Patent
Yokota

(10) Patent No.: US 11,955,788 B2
(45) Date of Patent: Apr. 9, 2024

(54) ELECTRICAL CONNECTION BOX

(71) Applicant: Sumitomo Wiring Systems, Ltd., Yokkaichi (JP)

(72) Inventor: Tomohiro Yokota, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 294 days.

(21) Appl. No.: 17/597,436

(22) PCT Filed: Jun. 30, 2020

(86) PCT No.: PCT/JP2020/025607
§ 371 (c)(1),
(2) Date: Jan. 6, 2022

(87) PCT Pub. No.: WO2021/006108
PCT Pub. Date: Jan. 14, 2021

(65) Prior Publication Data
US 2022/0320844 A1  Oct. 6, 2022

(30) Foreign Application Priority Data

Jul. 8, 2019  (JP) .................................. 2019-127128

(51) Int. Cl.
*H02G 3/16*  (2006.01)
*H02G 3/18*  (2006.01)

(52) U.S. Cl.
CPC .................. *H02G 3/16* (2013.01); *H02G 3/18* (2013.01)

(58) Field of Classification Search
None
See application file for complete search history.

(56) References Cited

U.S. PATENT DOCUMENTS 5,791,936 A * 8/1998 Nicholson .......... H01R 13/5213
439/521
5,916,002 A * 6/1999 Gottschalk ............ H01R 13/111
439/839

(Continued)

FOREIGN PATENT DOCUMENTS

DE     19548961 A1 * 7/1996  ............. H01R 31/00
GB     2230389 A   * 10/1990  ............... H01R 9/24

(Continued)

OTHER PUBLICATIONS

International Search Report, Application No. PCT/JP2020/025607, dated Sep. 15, 2020. ISA/Japan Patent Office.

*Primary Examiner* — Krystal Robinson
(74) *Attorney, Agent, or Firm* — Honigman LLP

(57) ABSTRACT

Provided is an electrical connection box capable of being installed in a vehicle, including a terminal block; a bus bar provided on the terminal block; and a housing that covers at least a portion of the terminal block and into which a plurality of electrical wires configured to be connected to the bus bar are inserted, wherein the terminal block is provided with a plurality of guide walls that guide the plurality of electrical wires toward the bus bar; the plurality of guide walls are disposed side by side extending from the housing side toward the bus bar side; and a distance from any one guide wall to an other guide wall on the bus bar side is greater than a distance from the any one guide wall to the other guide wall on the housing side.

9 Claims, 8 Drawing Sheets

(56) References Cited

U.S. PATENT DOCUMENTS

| | | | | |
|---|---|---|---|---|
| 6,296,498 B1* | 10/2001 | Ross | .................... | H01R 25/145 |
| | | | | 439/115 |
| 2002/0048994 A1* | 4/2002 | Oota | ....................... | H01R 9/24 |
| | | | | 439/98 |
| 2005/0045361 A1 | 3/2005 | Arai et al. | | |
| 2005/0136707 A1* | 6/2005 | Kiyota | ................. | H01R 13/514 |
| | | | | 439/76.2 |
| 2008/0200045 A1* | 8/2008 | Akahori | ............... | H01R 13/514 |
| | | | | 439/76.2 |
| 2013/0330985 A1* | 12/2013 | Wilinski | .............. | H01R 13/629 |
| | | | | 29/874 |
| 2017/0222377 A1* | 8/2017 | Sakurada | .............. | H01R 25/162 |
| 2017/0305370 A1* | 10/2017 | Yamashita | ............. | H02G 3/083 |
| 2018/0083375 A1* | 3/2018 | Matsumura | ......... | B60R 16/0238 |
| 2018/0277328 A1 | 9/2018 | Kawarazaki et al. | | |

FOREIGN PATENT DOCUMENTS

| | | | |
|---|---|---|---|
| JP | 2005-185018 A | 7/2005 |
| JP | 2006-025515 A | 1/2006 |
| JP | 2011-030300 A | 2/2011 |
| JP | 2014-233160 A | 12/2014 |
| JP | 2018-163772 A | 10/2018 |

\* cited by examiner d 1 : OUTER DIAMETER OF ELECTRICAL WIRE
d 2 : DISTANCE BETWEEN INNER SURFACE OF HOUSING AND UPPER END SURFACE OF GUIDE WALL d 1 > d 2

ELECTRICAL CONNECTION BOX

CROSS-REFERENCE TO RELATED APPLICATIONS

This application is the U.S. national stage of PCT/JP2020/025607 filed on Jun. 30, 2020, which claims priority of Japanese Patent Application No. JP 2019-127128 filed on Jul. 8, 2019, the contents of which are incorporated herein.

TECHNICAL FIELD

The present disclosure relates to an electrical connection box.

BACKGROUND

An electrical wire installed in a vehicle for supplying electric power from an in-vehicle battery to in-vehicle loads in the vehicle is first connected to a junction box, branches in the junction box, and connects to each of the in-vehicle loads. Such a junction box internally includes a bus bar, and an opening portion for inserting an electrical wire is provided on a housing of the junction box (see JP 2018-163772A, for example). In the junction box of JP 2018-163772A, the electrical wire inserted from the opening portion of the housing is connected to the bus bar provided in a central portion of the internal space of the housing.

In the junction box of JP 2018-163772A, a portion for guiding the electrical wire in the insertion direction is not provided in the area from the opening portion where the electrical wire is inserted to the bus bar to which an end portion (LA terminal) of the electrical wire is connected. This may reduce the manufacturing efficiency.

The present disclosure is directed at providing an electrical connection box with enhanced manufacturing efficiency
SUMMARY An electrical connection box according to an aspect of the present disclosure is an electrical connection box capable of being installed in a vehicle and includes a terminal block; a bus bar provided on the terminal block; and a housing that covers at least a portion of the terminal block and into which a plurality of electrical wires configured to be connected to the bus bar are inserted, wherein the terminal block is provided with a plurality of guide walls that guide the plurality of electrical wires to the bus bar; the plurality of guide walls are disposed side by side extending from the housing side toward the bus bar side; and a distance from any one guide wall to an other guide wall on the bus bar side is greater than a distance from the any one guide wall to the other guide wall on the housing side.

Advantageous Effects of Present Disclosure

According to an aspect of the present disclosure, the manufacturing efficiency of an electrical connection box can be enhanced.

DETAILED DESCRIPTION OF PREFERRED EMBODIMENTS

Figure 1:
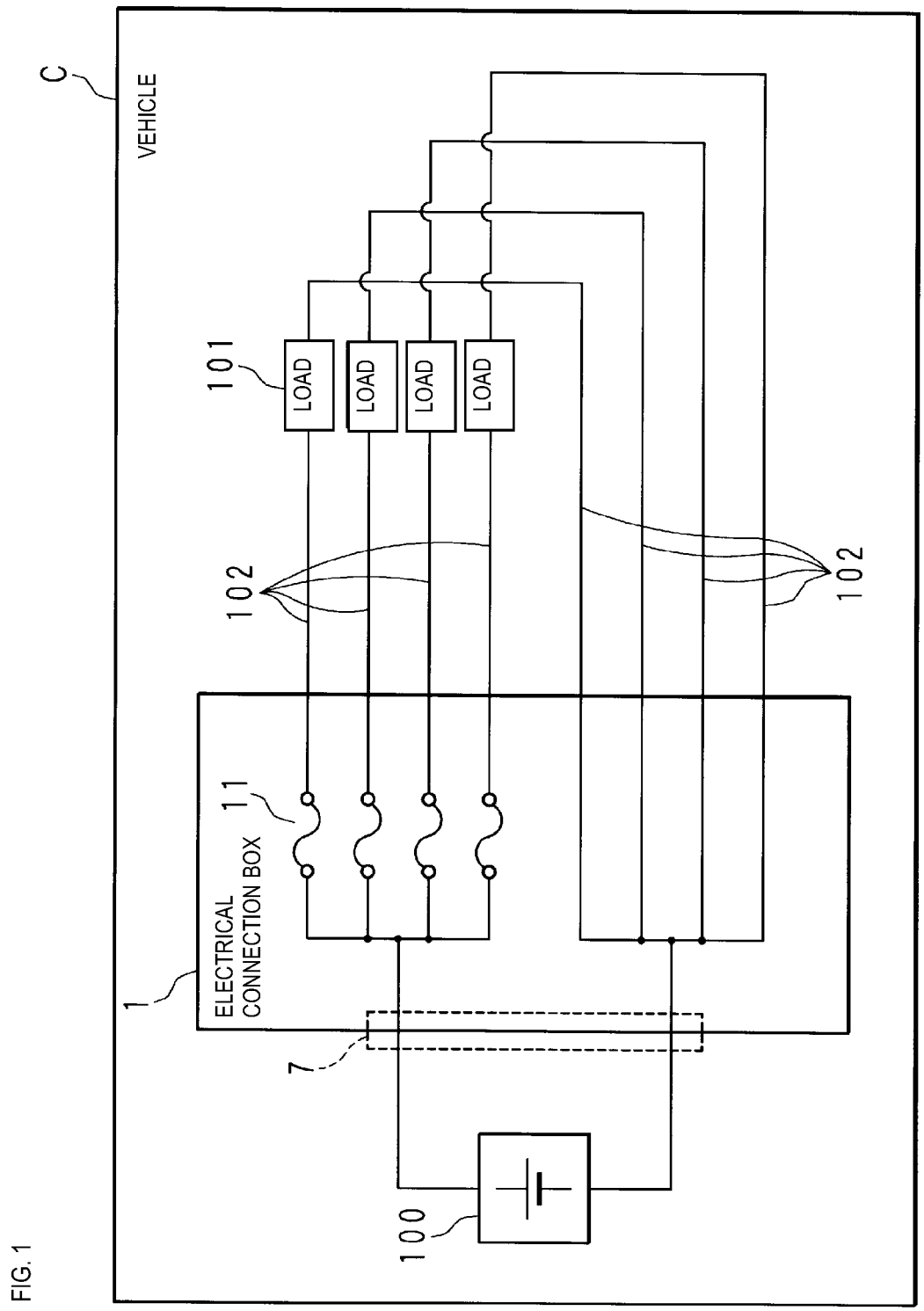
FIG. 1 is a schematic view illustrating a vehicle installed with an electrical connection box according to a first embodiment.

Firstly, embodiments of the present disclosure will be listed and described. One or more parts of the embodiments described below may be combined in a discretionary manner.

An electrical connection box according to an aspect of the present disclosure is an electrical connection box capable of being installed in a vehicle and includes a terminal block; a bus bar provided on the terminal block; and a housing that covers at least a portion of the terminal block and into which a plurality of electrical wires configured to be connected to the bus bar are inserted, wherein the terminal block is provided with a plurality of guide walls that guide the plurality of electrical wires to the bus bar; the plurality of guide walls are disposed side by side extending from the housing side toward the bus bar side; and a distance from any one guide wall to an other guide wall on the bus bar side is greater than a distance from the any one guide wall to the other guide wall on the housing side.

According to the present aspect, in the terminal block, the plurality of guide walls are disposed side by side extending from the housing side to the bus bar side, and the distance between any one guide wall and an other guide wall on the bus bar side is greater than the distance between the any one guide wall and the other guide wall on the housing side. Accordingly, by guiding the plurality of electrical wires inserted from the housing via the guide walls, the plurality of electrical wires can be routed with the distance between electrical wires increasing from the housing side toward the bus bar side and the electrical wires separating out in a fan-like manner are they extending in the insertion direction. In this manner, the electrical wires can be efficiently guided toward the bus bars which take up a larger region than the opening where the plurality of electrical wires are inserted into the housing, and the manufacturing efficiency when installing the electrical connection box in a vehicle can be enhanced. Also, the distance between any one guide wall and another guide wall on the housing side is less than the distance between the any one guide wall and the other guide wall on the bus bar side. Thus, the plurality of electrical wires can be gathered together at the point where they are inserted into the housing. This allows for the size of the electrical connection box to be decreased and for the insulation distance between terminals of the electrical wires that are connected to the bus bars to be ensured.

In the electrical connection box according to an aspect of the present disclosure, the plurality of guide walls each have a linear shape, and a distance between surfaces of any two adjacent guide walls increases from the housing side toward the bus bar side.

According to the present aspect, the plurality of guide walls each have a linear shape, and the distance between surfaces of two adjacent guide walls increases from the housing side toward the bus bar side. This allows the distance between the guide walls to be easily formed to be greater on the bus bar side compared to the housing side.

In the electrical connection box according to an aspect of the present disclosure, the plurality of guide walls include a guide wall with a linear shape and a guide wall with a curved shape.

According to the present aspect, the plurality of guide walls include a guide wall with a linear shape and a guide wall with a curve shape. Thus, the distance between guide walls is easy to make greater on the bus bar side compared to the housing side by the wall surfaces of the guide walls, formed of the guide wall with a linear shape and the guide wall with a curve shape, being disposed side by side facing one another.

In the electrical connection box according to an aspect of the present disclosure, one or more guide walls of the plurality of guide walls includes a narrow width portion and a broad width portion with a plate thickness greater than the narrow width portion, and the broad width portion is provided on an end portion on the housing side.

According to the present aspect, the guide wall includes the broad width portion with a plate thickness greater than the narrow width portion. This allows the strength of the guide wall to be enhanced. Also, because the broad width portion is provided at the end portion on the housing side, the impact resistance of the guide wall can be enhanced regarding the terminal (LA terminal) provided on the leading end of the electrical wire colliding with the broad width portion of the guide wall when the electrical wire is inserted from the housing.

In the electrical connection box according to an aspect of the present disclosure, the broad width portion is provided with a recess portion.

According to the present aspect, the broad width portion is provided with the recess portion. This can help prevent the strength of the guide wall from being reduced by provided the broad width portion and can reduce the amount of resin or other similar material needed for forming the guide wall.

In the electrical connection box according to an aspect of the present disclosure, a distance between an inner surface of the housing and an upper end surface of a guide wall facing the inner surface is less than an outer diameter of the plurality of electrical wires.

Regarding the present aspect, the distance between the inner surface of the housing and the upper end surface of the guide wall facing the inner surface is less than the outer diameter of the electrical wires. This can help prevent the electrical wires inserted from the housing from jumping out from the gap between the inner surface of the housing and the upper end surface of the guide wall. In other words, the terminal of any electrical wire can be prevented from being connected with a bus bar other than the bus bar it should be connected to, i.e., a mismatch, when the electrical wires are guided toward the bus bar side by the guide walls.

In the electrical connection box according to an aspect of the present disclosure, the terminal block is provided with a plurality of partition plates that extend in a linear manner, the plurality of partition plates are located between the bus bars where the plurality of electrical wires are connected, and end portions on the bus bar side of the guide walls corresponding to the plurality of partition plates are located on extension lines in an extension direction of the partition plates.

According to the present aspect, the plurality of partition plates are located between the end portions of the bus bars to which the plurality of electrical wires are connected, and the end portions of the guide walls on the bus bar side corresponding to the partition plates are located on extension lines in the extension direction of the partition plates. This allows the electrical wires guided by the guide plates to be guided to the end portions of the bus bars located to the side of the partition plates corresponding to the guide walls.

In the electrical connection box according to an aspect of the present disclosure, the plurality of electrical wires are configured to connect an electrical energy storage device capable of being installed in the vehicle and a plurality of in-vehicle loads connected in parallel, an insertion space where the plurality of electrical wires are inserted is formed between an adjacent pair of guide walls, and a positive electrode and a negative electrode pair of electrical wires configured to be connected to the same in-vehicle load are inserted into the insertion space.

According to the present aspect, a positive electrode and negative electrode pair of electrical wires that are connected to the same in-vehicle load are inserted between the insertion space between two adjacent guide walls. Thus, the pair of electrical wires can be guided at the same time, and the manufacturing efficiency when installing the electrical connection box in the vehicle can be further enhanced.

In the electrical connection box according to an aspect of the present disclosure, the electrical energy storage device is a high voltage battery, and the bus bar is a bus bar for high voltage.

According to the present aspect, the electrical energy storage device is a high voltage battery, and the bus bar is a bus bar for high voltage. Thus, the manufacturing efficiency when the electrical connection box for high voltage including a bus bar for high voltage is installed in a vehicle can be enhanced.

A specific example of an electrical connection box 1 according to an embodiment of the present disclosure will be described with reference to the attached drawings. Note that the present disclosure is not limited to these examples and is defined by the scope of the claims, and all modifications that are equivalent to or within the scope of the claims are included.

First Embodiment

FIG. 1 is a schematic view illustrating a vehicle C installed with the electrical connection box 1 according to the first embodiment. The electrical connection box 1 of the present embodiment is installed in the vehicle C between an electrical energy storage device 100 and a plurality of in-vehicle loads 101 installed in a similar manner in the vehicle C. The electrical energy storage device 100 and the plurality of in-vehicle loads 101 are electrically connected via the electrical connection box 1 and electrical wires 102 connecting the electrical energy storage device 100 and the plurality of in-vehicle loads 101.

The electrical energy storage device 100 is a lead battery or a high voltage battery for an electric vehicle (EV) such as a lithium ion battery, for example.

The in-vehicle loads 101 include, for example, a drive motor, a vehicle air conditioner, and an in-vehicle ECU or in-vehicle relay device or the like. The device of the plurality of in-vehicle loads 101 are connected in parallel with each other, and a voltage output from the electrical energy storage device 100 is applied to the devices of the plurality of in-vehicle loads 101 via the electrical connection box 1.

The electrical connection box 1 is located between the electrical energy storage device 100 and the devices of the plurality of in-vehicle loads 101, and the electrical connection box 1 and the electrical energy storage device 100 are connected via a connector 4 of the electrical connection box 1. The electrical connection box 1 and the electrical energy storage device 100 are connected via the electrical wire 102 on the positive electrode side of the electrical energy storage device 100 and the electrical wire 102 on the negative electrode side of the electrical energy storage device 100. In a similar manner, the electrical connection box 1 and the plurality of in-vehicle loads 101 connected in parallel are connected via the branched positive electrode electrical wires 102 and the branched negative electrode electrical wires 102.

The positive electrode electrical wire 102 stored in the electrical connection box 1 branches into a plurality of electrical wires 102 (four in FIG. 1) inside the electrical connection box 1. In a similar manner, the negative electrode electrical wire 102 stored in the electrical connection box 1 branches into a plurality of electrical wires 102 (four in FIG. 1) inside the electrical connection box 1. Each of the branched electrical wires 102 connect to one of the in-vehicle loads 101, forming a parallel circuit.

The electrical connection box 1, for example, includes an electronic component 11, such as a fuse, a relay, a semiconductor switch, or the like. Each branched electrical wire 102 on the positive electrode is provided with the electronic component 11. Where the electronic component 11, a fuse or the like, is placed on the circuit is not limited to being on the positive electrode side, and the electronic component 11 may be placed on the negative electrode side.

In a case where one of the in-vehicle loads 101 short circuits, for example, in the electrical connection box 1 with such a configuration, the fuse melts due to the overcurrent, and the path of the electrical wire 102 connecting the in-vehicle load 101 is electrically cut off. In this manner, the electrical connection box 1 functions as a protection device and is particularly useful for EVs and the like installed with a high voltage battery.

Figure 2:
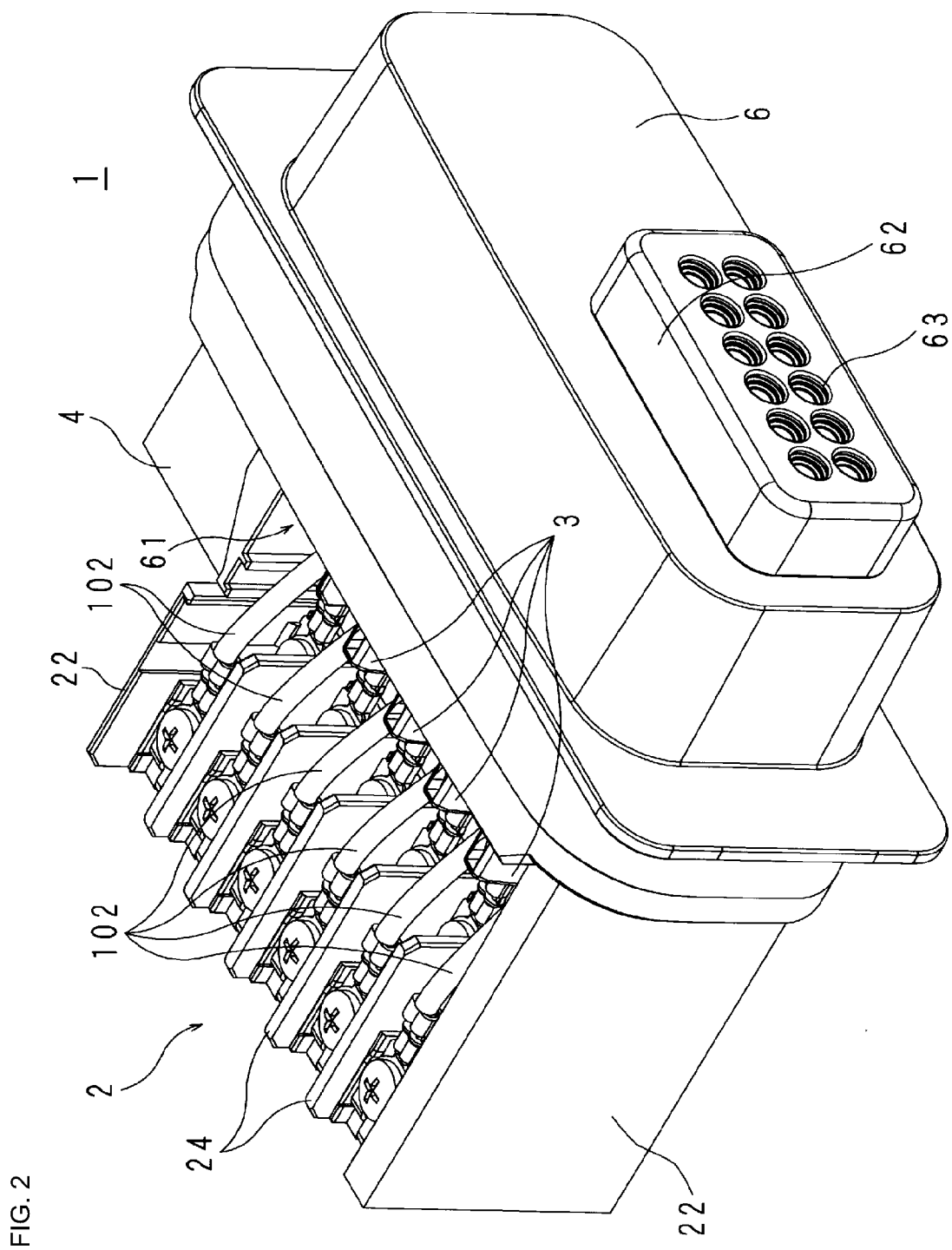
FIG. 2 is a perspective view illustrating the external appearance of an electrical connection box.
Figure 3:
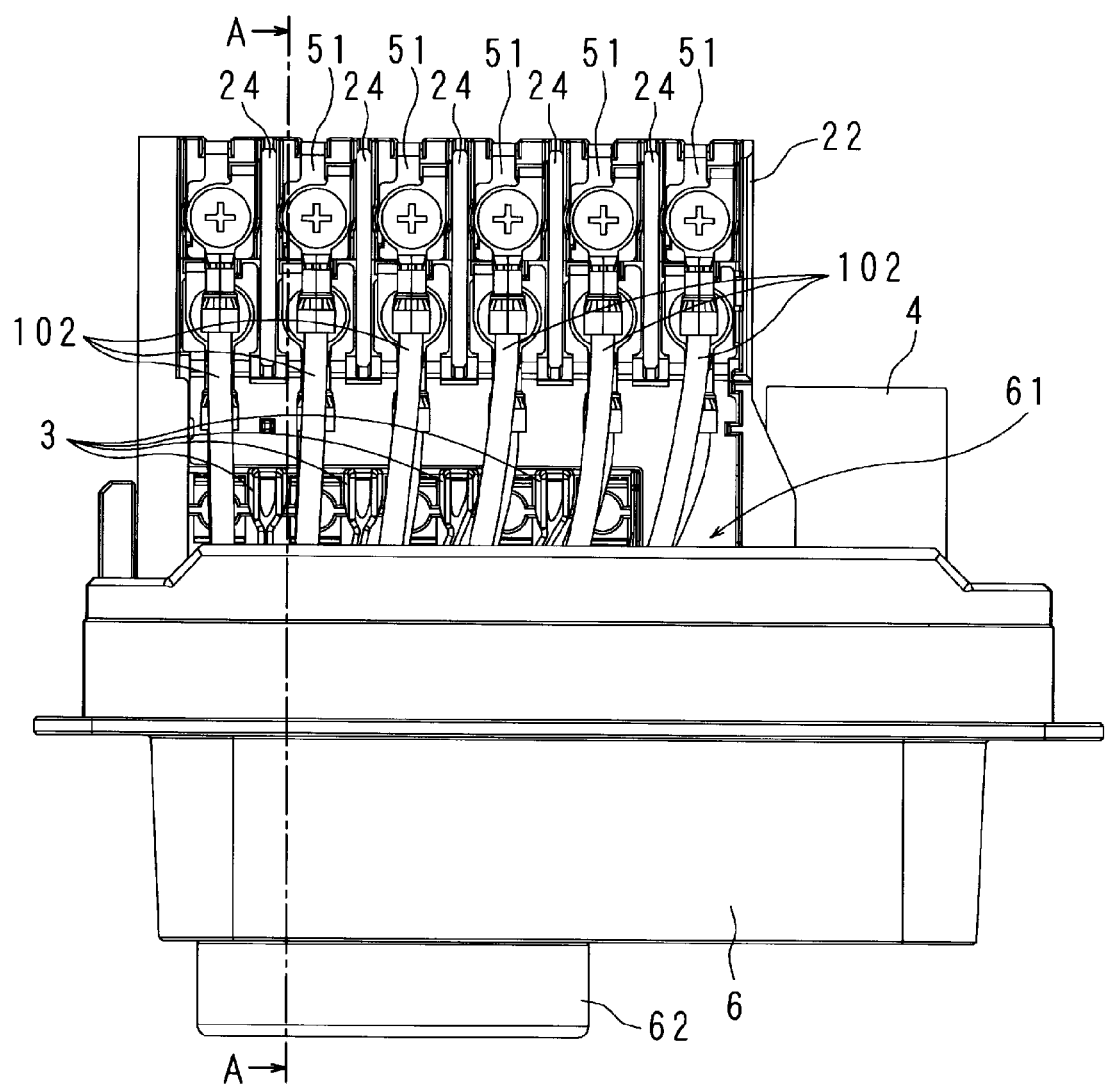
FIG. 3 is a plan view of an electrical connection box.
Figure 4:
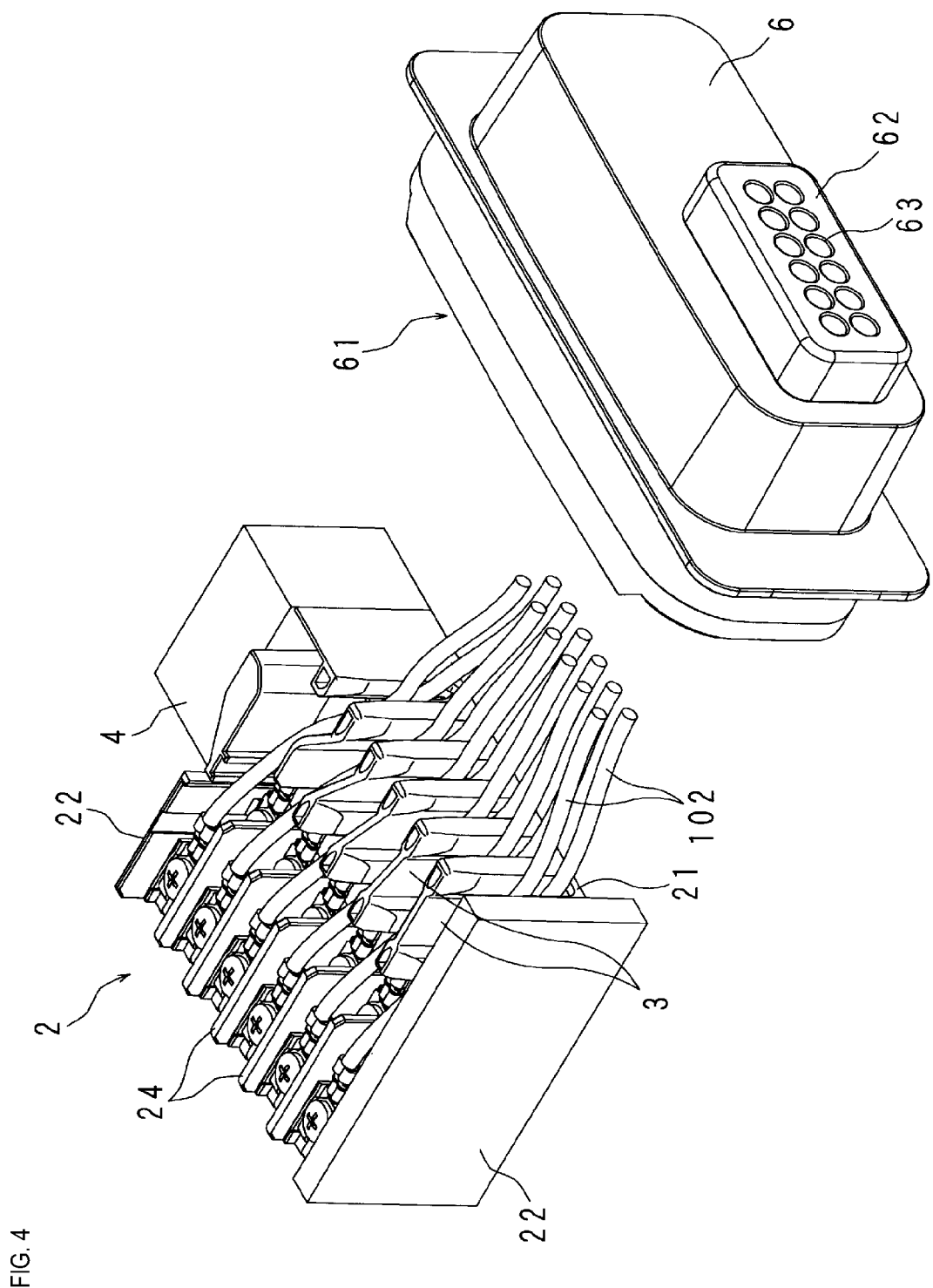
FIG. 4 is an exploded perspective view of an electrical connection box.

FIG. 2 is a perspective view illustrating the external appearance of the electrical connection box 1. FIG. 3 is a plan view of the electrical connection box 1. FIG. 4 is an exploded perspective view of the electrical connection box 1. In the present embodiment, for the sake of convenience, the front, back, left, right, up, and down of the electrical connection box are defined by the directions front and back, left and right, and up and down illustrated in FIGS. 2, 3, 4, and the like. The directions front and back, left and right, and up and down defined in this manner are used in the description below. The electrical connection box 1 includes a terminal block 2 where the electrical wires 102 are fastened and a housing 6 that covers a portion of the terminal block 2.

The housing 6 is, for example, made of metal with a high heat dissipation such as aluminum and has a box-like shape with an opening portion 61 formed therein. The bottom plate of the housing 6 is provided with a projection portion 62 with a rectangular parallelepiped shape provided with a plurality of insertion holes 63 where the electrical wires 102 are inserted. The bottom plate of the housing 6 has a rectangular shape, and, at the bottom plate, the projection portion 62 is provided at a position offset toward the peripheral edge in the longitudinal direction (offset to the left side when viewing the surface of FIG. 2).

The insertion holes 63 are disposed in the front surface of the projection portion 62 and are arranged side by side at an equal intervals in two rows, upper and lower (in FIG. 2, two rows, upper and lower, and six columns). In other words, the insertion holes 63 are disposed in the front surface of the projection portion 62 with a rectangular shape, with a plurality (in FIG. 2, six) of pairs in the short side direction (i.e., upper and lower pairs) of insertion holes 63 arranged side by side in the long side direction.

The electrical wires 102 (see FIG. 1) connected to the in-vehicle loads 101 (see FIG. 1) are inserted into the housing 6 from the plurality of insertion holes 63, are run inside the housing 6, and then are fastened to bus bars 51, described below, provided on the terminal block 2. As described above, the electrical connection box 1 and the plurality of in-vehicle loads 101 are connected via the branched positive electrode electrical wires 102 and the branched negative electrode electrical wires 102.

The positive electrode electrical wire 102 and the negative electrode electrical wire 102 connected to the same in-vehicle load 101 may be inserted into two (an upper and lower pair) of the insertion holes 63 arranged in the short side direction, i.e., an upper and lower pair of the insertion holes 63 in the same column, at the front surface of the projection portion 62. For example, of the positive electrode electrical wire 102 and the negative electrode electrical wire 102 connected to the same in-vehicle load 101, the positive electrode electrical wire 102 may be inserted into the upper insertion hole 63 of the pair of insertion holes 63, and the negative electrode electrical wire 102 may be inserted into the lower insertion hole 63 of the pair of insertion holes 63.

The terminal block 2, for example, is made of a synthetic resin with insulating properties such as polyester, side wall portions 22 are provided on the left and right end of a base portion 21 with a plate-like shape, and the side of the terminal block 2 covered by the housing 6 has an open rectangular parallelepiped box-like shape. The terminal block 2 includes a plurality of guide walls 3, a plurality of partition plates 24, and the connector 4, and the bus bars 51 to which the electrical wires 102 are fastened are provided between adjacent partition plates 24. Details of the structure of the terminal block 2 will be described below with reference to FIG. 5.

As illustrated in FIG. 4, the housing 6 is provided with the opening portion 61 facing the terminal block 2 so as to cover the terminal block 2 from the side where the guide walls 3 are provided. Accordingly, the housing 6 is provided in a manner so as to cover a portion of the guide walls 3 and cover a storage portion for storing a conductive member for connecting the connector 4 and the electrical wires 102. With the housing 6 not covering the terminal block 2 from the side where the partition plates 24 are provided, the partition plates 24 are put in an exposed state. In other words, the terminal block 2 is provided in a manner so as to be inserted inside the housing 6 from the side where the guide walls 3 are provided, and the portion of the terminal block 2 where the guide walls 3 are provided is stored inside the housing 6. The electrical connection box 1 configured so that the terminal block 2 and the housing 6 engage in this manner is installed in the vehicle C by the housing 6 of the electrical connection box 1 being fastened to the frame or the like of the vehicle C, for example.

Figure 5:
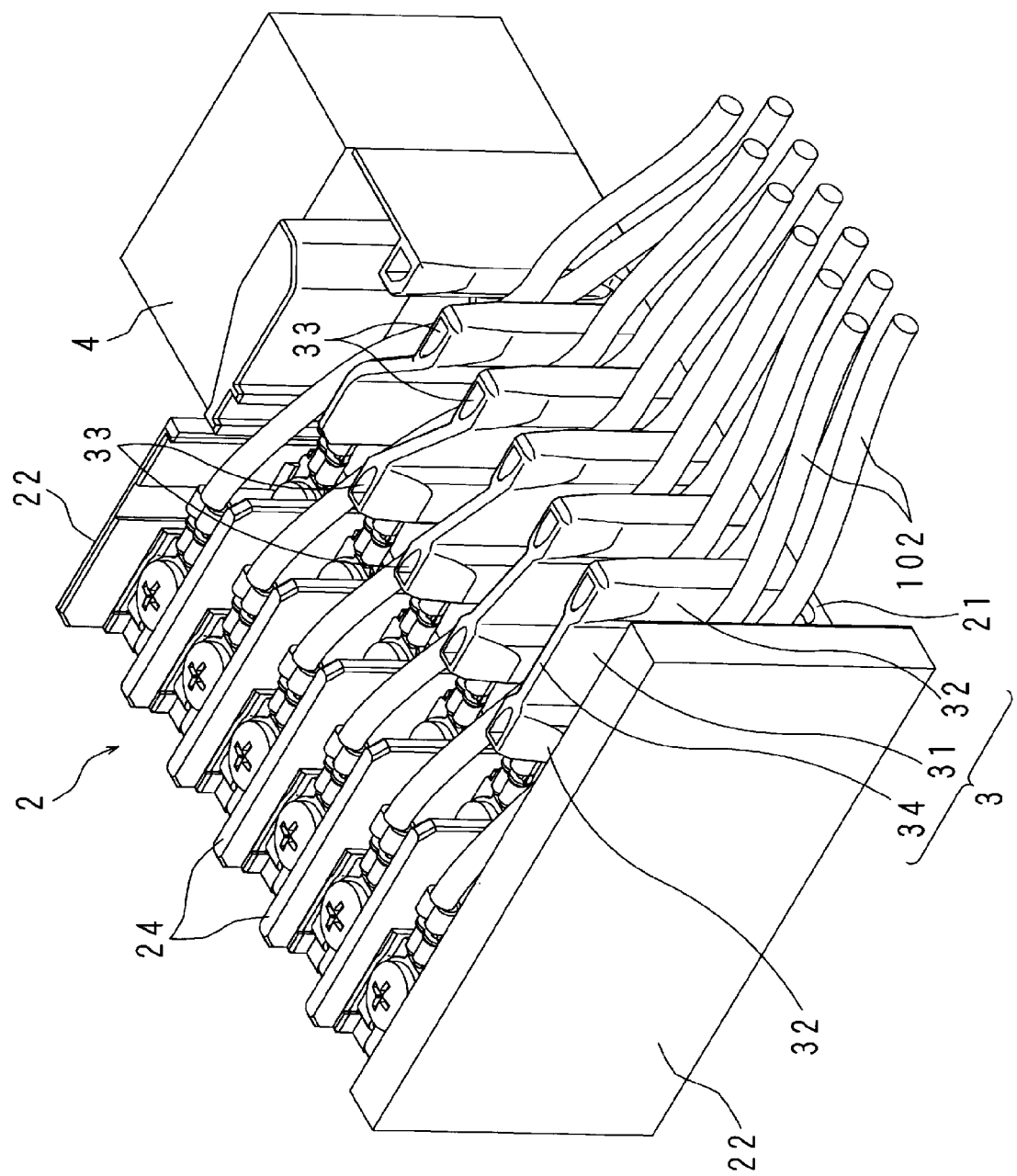
FIG. 5 is a perspective view of an electrical connection box in a state with a housing removed.
Figure 6:
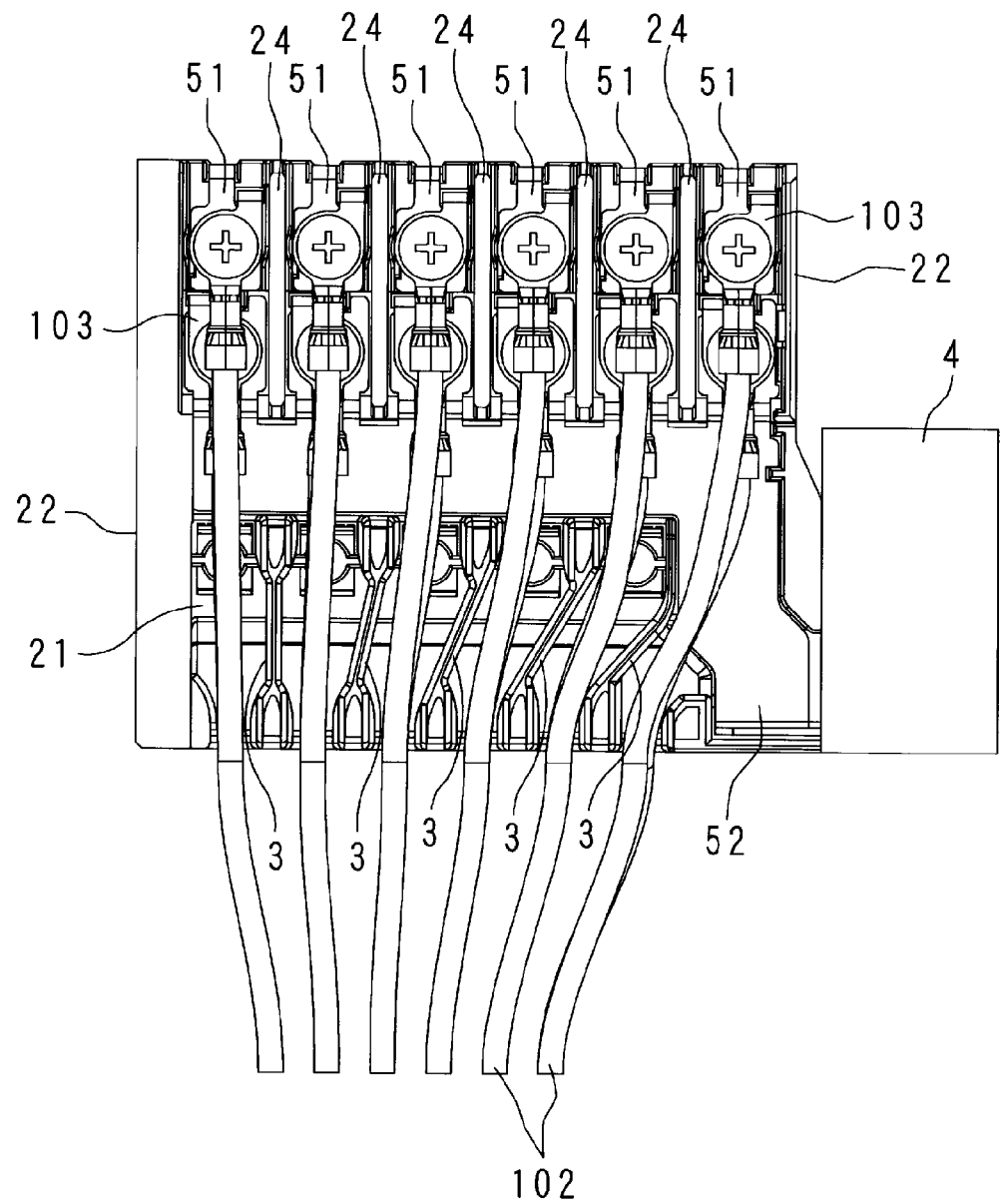
FIG. 6 is a plan view of an electrical connection box in a state with a housing removed.

FIG. 5 is a perspective view of the electrical connection box 1 in a state with the housing 6 removed. FIG. 6 is a plan view of the electrical connection box 1 in a state with the housing 6 removed. In FIGS. 5 and 6, the housing 6 is removed from the electrical connection box 1, and the electrical wires 102 are fastened to the terminal block 2.

The terminal block 2 includes the base portion 21 with a plate-like shape, and the side wall portions 22 are provided on the left and right ends of the base portion 21. The base portion 21 and the side wall portions 22 give the terminal block 2 a C shape in a cross-sectional view.

Figure 7:
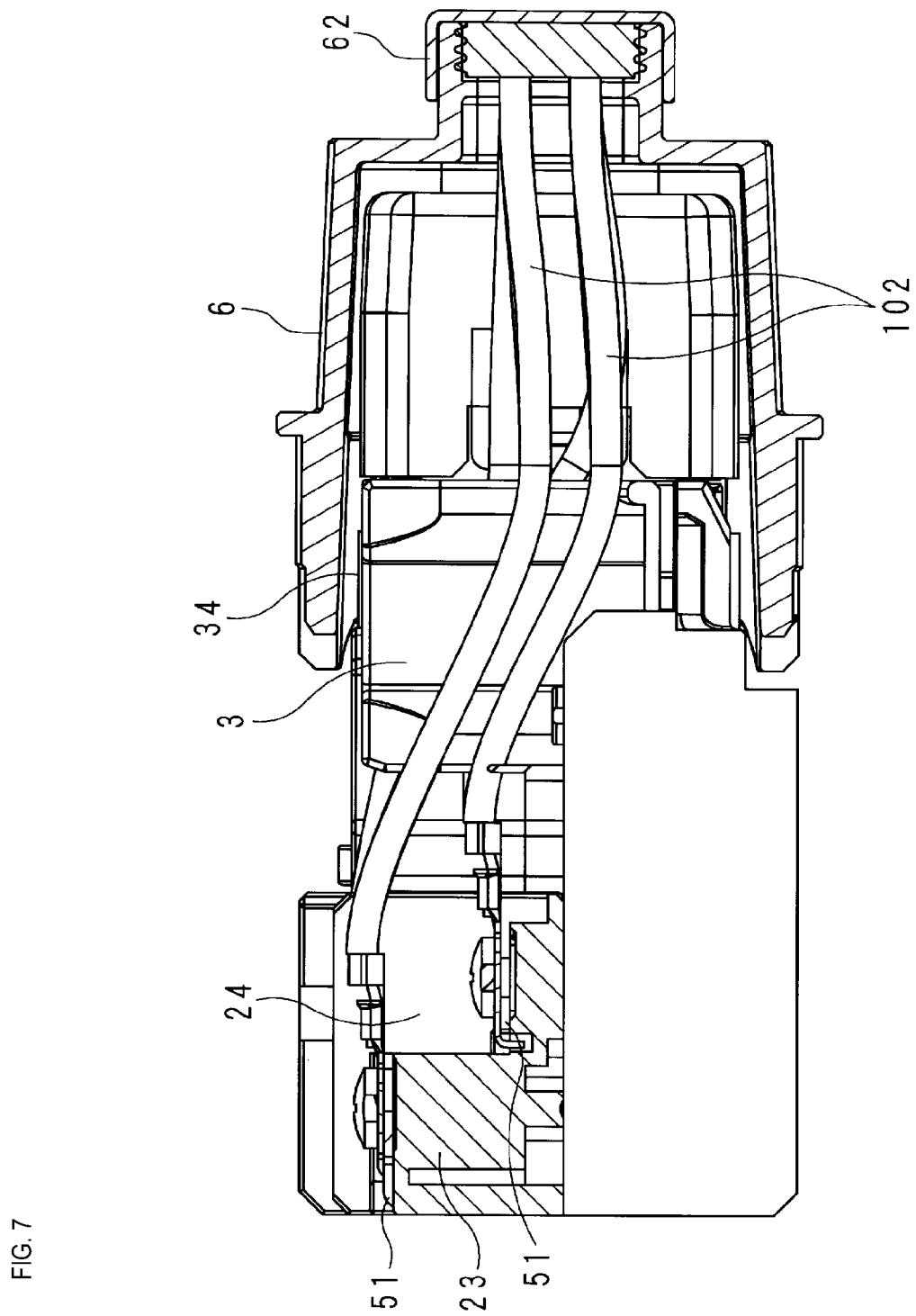
FIG. 7 is a cross-sectional view taken along line A-A of FIG. 3.

The terminal block 2 includes the plurality of bus bars 51 to which the plurality of electrical wires 102 inserted through the housing 6 are fastened, and the plurality of bus bars 51 are provided on a support 23 (see FIG. 7). The bus bars 51 are plate-like members made of metal with a high electrical conductivity such as copper, and the bus bars 51 and the connector 4 are electrically connected inside the electrical connection box 1. The bus bars 51 may be bus bars 51 for high voltage with an electric capacity suited for high voltage batteries.

The support 23 of the bus bars 51 to which the positive electrode electrical wires 102 are fastened and the support 23 (see FIG. 7) of the bus bars 51 to which the negative electrode electrical wires 102 are fastened form a step. As described above, the plurality of electrical wires 102 include the positive electrode electrical wires 102 and the negative electrode electrical wires 102, and the positive electrode electrical wire 102 and the negative electrode electrical wire 102 connected to the same in-vehicle load 101 form a pair of electrical wires 102. In the present embodiment, the support 23 of the bus bar 51 to which the positive electrode electrical wire 102 is fastened is located on the upper level, and the support 23 of the bus bar 51 to which the negative electrode electrical wire 102 is fastened is located on the lower level. However, no such limitation is intended, and the negative electrode bus bar 51 may be located on the upper level, and the positive electrode bus bar 51 may be located on the lower level. The electrical wire 102 and the bus bar 51 are fastened together by bolting together an LA terminal 103 provided on the leading end of the electrical wire 102 and the support 23 where the bus bar 51 is placed.

As illustrated in FIG. 6, the pair of electrical wires 102 connected to the same in-vehicle load 101 are disposed in the same column, from among the plurality of columns formed by the partition plates 24, and are fastened to the positive electrode bus bar 51 and the negative electrode bus bar 51. The fastening portion where the positive electrode bus bar 51 and the electrical wire 102 are fastened together is formed into its own section by the partition plates 24. The positive electrode fastening portions (adjacent positive electrode bus bars 51) disposed adjacent to one another interposed by the partition plate 24 are insulated. In other words, the partition plates 24 function as insulation walls for insulating adjacent pairs of fastening portions. In a similar manner, the fastening portion where the negative electrode bus bar 51 and the electrical wire 102 are fastened together is formed into its own section by the partition plates 24, and negative electrode fastening portions (adjacent negative electrode bus bars 51) disposed adjacent to one another interposed by the partition plate 24 are insulated. The positive electrode and negative electrode pair of electrical wires 102 connected to the same in-vehicle load 101 are disposed in the same column, from among the plurality of columns formed by the partition plates 24. Thus, the positive electrode bus bar 51 and the negative electrode bus bar 51 to which the pair of electrical wires 102 are fastened are partitioned off from the other bus bars 51 by the same partition plates 24.

The connector 4 connected to the electrical energy storage device 100 is provided on the outer surface of one of the side wall portions 22. The connector 4 has a cylindrical shape with a closed bottom, and the bottom portion of the connector 4 is provided with a storage portion for storing the conductive member for connecting the connector 4 and the electrical wires 102. The storage portion is provided projecting further to the housing 6 side than the end portion of the base portion 21 on the housing 6 side (see FIG. 4). The connector 4 and the bus bars 51 are connected via an L-shaped bus bar 52 provided in a central portion of the upper surface of the base portion 21 and the conductive member stored in the storage portion.

The guide walls 3 are provided on the base portion 21 of the terminal block 2 projecting out from the base portion 21. The plurality of guide walls 3 each have a plate-like shape and are provided side by side between the side wall portions 22 with side walls facing one another. The plurality of guide walls 3 are provided with the side surfaces of the guide walls 3 aligned with the insertion direction of the electrical wires 102 that are inserted. In other words, the guide walls 3 are provided on the upper surface of the base portion 21 extending from the housing 6 side toward the bus bars 51 side, and adjacent pairs of the guide walls 3 are disposed side by side with side surfaces facing one another.

The guide walls 3 each include a narrow width portion 31 and a broad width portion 32 which is wider than the narrow width portion 31 in terms of the plate width of the wall. The broad width portion 32 is located on each end of the guide wall 3, and thus the guide wall 3 is provided with two broad width portions 32 formed by the broad width portion 32 located on the housing 6 side and the broad width portion 32 located on the bus bar 51 side. The narrow width portion 31 is located between the broad width portions 32. In other words, the guide wall 3 includes two broad width portions 32 (the broad width portion 32 located on the housing 6 side and the broad width portion 32 located on the bus bar 51 side) located on both ends and the narrow width portion 31 located between the broad width portions 32.

The broad width portion 32 on the housing 6 side is located at the peripheral edge of the base portion 21. The broad width portion 32 on the bus bar 51 side is located at the central portion of the base portion 21. The guide walls 3 are provided with the side surfaces of the guide walls 3 aligned with the insertion direction of the electrical wires 102, and the electrical wires 102 are inserted from the housing 6 toward the bus bars 51. Accordingly, the electrical wire 102 inserted through the inside of the housing 6 passes by the side of the broad width portion 32 on the housing 6 side, passes by the side of the narrow width portion 31, and then passes by the side of the broad width portion 32 on the bus bar 51 side, reaching the bus bar 51.

The guide wall 3 is not limited to including the broad width portion 32 on the housing 6 side and the broad width portion 32 on the bus bar 51 side. The guide wall 3 may include only the broad width portion 32 on the housing 6 side. In a case where the guide wall 3 includes only the broad width portion 32 on the housing 6 side, the narrow width portion 31 continuous with the broad width portion 32 extends to the bus bar 51 side. As illustrated in FIGS. 5 and 6, the guide wall 3 provided closest to the side wall portion 22 where the connector 4 is provided is formed by the broad width portion 32 on the housing 6 side and the narrow width portion 31 continuous with the broad width portion 32. The broad width portion 32 on the bus bar 51 side is not provided, and the narrow width portion 31 extends toward the bus bar 51. This allows a region to be secured for disposing the L-shaped bus bar 52 for connecting the bus bars 51 and the connector 4.

By the broad width portion 32 (the broad width portion 32 on the housing 6 side) being provided at the end portion of the guide wall 3 on the housing 6 side, even when the LA terminal 103 provided on the leading end of the electrical wire 102 hits the guide wall 3 when the electrical wire 102 is inserted from the housing 6 side, the impact of the collision with the LA terminal 103 is absorbed by the broad width portion 32 with high rigidity. In this manner, the durability of the guide walls 3 can be enhanced.

The guide wall 3 projects out from the upper surface of the base portion 21, and an upper end surface 34 is formed on the leading end of the projecting guide wall 3. Because the guide wall 3 is formed by the two broad width portion 32 and the narrow width portion 31 located between the broad width portions 32, the upper end surface 34 of the guide wall 3 is formed by the upper end surface of the two broad width portions 32 and the narrow width portion 31. The guide wall 3 provided closest to the side wall portion 22 where the connector 4 is provided is formed by the broad width portion 32 on the housing 6 side and the narrow width portion 31. Thus, the upper end surface 34 of this guide wall 3 is formed by the upper end surface of the broad width portion 32 on the housing 6 side and the narrow width portion 31.

A recess portion 33 is formed in the upper end surface of the broad width portion 32. The recess portion 33 is formed by a recess provided in the upper end surface of the broad width portion 32. Alternatively, the recess portion 33 may be a hole extending through to the base portion 21 that is provided in the upper end surface of the broad width portion 32. The recess portion 33 is provided in the broad width portion 32 located on the housing 6 side and the broad width portion 32 located on the bus bar 51 side. Alternatively, the recess portion 33 may be provided in either the broad width portion 32 located on the housing 6 side or the broad width portion 32 located on the bus bar 51 side.

By the recess portion 33 being provided in the broad width portion 32, the rigidity provided by the broad width portion 32 can be prevented from being reduced and the amount of resin for forming the guide walls 3 can be reduced, allowing the manufacturing cost and the weight of the electrical connection box 1 to be reduced.

The narrow width portion 31 is formed in a linear or curved plate-like shape. The narrow width portion 31 of the guide wall 3 closest to the connector 4 has a curved shape, and the narrow width portion 31 of the other guide walls 3 has a linear shape. The narrow width portions 31 with a linear shape of the plurality of guide walls 3 are disposed at different angles from one another with respect to the insertion direction of the electrical wires 102.

Regarding the guide walls 3 disposed side by side, using the narrow width portion 31 of the guide wall 3 farthest from the connector 4, i.e., the guide wall 3 closest to the side wall portion 22 where the connector 4 is not provided, as a reference, the narrow width portion 31 of the reference guide wall 3 and the other narrow width portions 31 of the guide walls 3 are formed at difference inclination angles. The guide walls 3 are disposed side by side with each inclination angle between the narrow width portion 31 of the reference guide wall 3 and the other narrow width portions 31 of the guide walls 3 increasing the further away from the reference guide wall 3. In other words, the inclination angle between the narrow width portion 31 of the reference guide wall 3 and the narrow width portion 31 of the guide wall 3 located second from the reference guide wall 3 is greater than the inclination angle between the narrow width portion 31 of the reference guide wall 3 and the narrow width portion 31 of the guide wall 3 located next to the reference guide wall 3.

The guide walls 3 are provided with the distance (distance between surfaces) between the side surfaces of two adjacent narrow width portions 31 increasing from the housing 6 side toward the bus bar 51 side. Thus, in a plan view, the narrow width portions 31 form truncated V shapes separating as they extend from the housing 6 side to the bus bar 51 side in a fan-like manner.

Also regarding the guide wall 3 (the guide wall 3 closest to the connector 4) including the narrow width portion 31 with a curved shape and the narrow width portion 31 (narrow width portion 31 with a linear shape) of the reference guide wall 3 described above, in a similar manner, the distance (distance between surfaces) between the side surfaces of these narrow width portions 31 increases from the housing 6 side toward the bus bar 51 side. By the narrow width portion 31 having a curved shape, the distance between surfaces of these narrow width portions 31 can be increased from the housing 6 side to the bus bar 51 side using a simple structure.

In each of the guide walls 3, the narrow width portion 31 is provided between the broad width portion 32 on the housing 6 side and the broad width portion 32 on the bus bar 51 side. Accordingly, the distance between the broad width portion 32 on the bus bar 51 side of one guide wall 3 and the broad width portion 32 on the bus bar 51 side of another guide wall 3 is greater than the distance between the broad width portion 32 on the housing 6 side of that one guide wall 3 and the broad width portion 32 on the housing 6 side of that other guide wall 3. Also, the distance between the end portion on the bus bar 51 side of the narrow width portion 31 of the guide wall 3 closest to the connector 4 and the broad width portion 32 on the bus bar 51 side of the guide wall 3 farthest from the connector 4 is greater than the distance between the broad width portion 32 on the housing 6 side of the guide wall 3 closest to the connector 4 and the broad width portion 32 on the housing 6 side of the guide wall 3 farthest from the connector 4.

The broad width portion 32 (the end portion on the bus bar 51 side of the narrow width portion 31 in the guide wall 3 closest to the connector 4) on the bus bar 51 side corresponds to the end portion of the guide wall 3 on the bus bar 51 side. The broad width portion 32 on the housing 6 side corresponds to the end portion of the guide wall 3 on the housing 6 side. Accordingly, because the narrow width portions 31 of the guide walls 3 are arranged at inclination angles in this manner, the distance (distance between the end portions on the bus bar 51 side) between any one guide wall 3 and another guide wall 3 on the bus bar 51 side can be made greater than the distance (distance between end portions on the housing 6 side) between the any one guide wall 3 and the other guide wall 3 on the housing 6 side. Alternatively, by the narrow width portion 31 of the guide wall 3 having a curved shape, the distance between the end portions of the guide walls 3 on the bus bar 51 side can be made greater than the distance between the end portions of the guide walls 3 on the housing 6 side.

The distance between the end portions of guide walls 3 on the housing 6 side is less than the distance between the end portions of the guide walls 3 on the bus bar 51 side. Thus, when the plurality of electrical wires 102 pass through the end portions (the broad width portions 32 on the housing 6 side) of the guide walls 3 on the housing 6 side, the plurality of electrical wires 102 are gathered. In other words, a gathering portion for gathering the plurality of electrical wires 102 is formed by the end portions of the plurality of guide walls 3 on the housing 6 side. The distance between the end portions of guide walls 3 on the bus bar 51 side is greater than the distance between the end portions of the guide walls 3 on the housing 6 side. Thus, when the plurality of electrical wires 102 pass through the end portions (the broad width portions 32 on the bus bar 51 side) of the guide walls 3 on the bus bar 51 side, the plurality of electrical wires 102 are spread out. In other words, a spreading portion for spreading out the plurality of electrical wires 102 is formed by the end portions of the plurality of guide walls 3 on the bus bar 51 side. The plurality of electrical wires 102 that spread out after passing the end portions of the guide walls 3 on the bus bar 51 side are each fastened to their corresponding bus bar 51. Thus, when the plurality of electrical wires 102 are inserted into the insertion space formed by the plurality of guide walls 3, the plurality of electrical wires 102 are gathered and the width for inserting the electrical wires 102 into the insertion space is reduced, allowing for sufficient insulation distance to be secured for the bus bars 51.

As illustrated in FIG. 6, the L-shaped bus bar 52 for connecting the bus bars 51 and the connector 4 is disposed between the partition plates 24 and the guide walls 3. The short side portion of the L-shaped bus bar 52 is located between the connector 4 and the guide wall 3 closest to the connector 4. Because the region for disposing the short side portion of the L-shaped bus bar 52 is secured, the guide walls 3 are provided with the broad width portions 32 of the guide walls 3 on the housing 6 side being provided offset toward the side wall portion 22 side where the connector 4 is not provided.

The partition plates 24 are disposed side by side at equal intervals in the long side direction of the long side portion of the L-shaped bus bar 52 between the side wall portions 22. Thus, the distance between the two partition plates 24 located on both ends of the base portion 21 is greater than the distance between the broad width portions 32 on the housing 6 side of the two guide walls 3 located on both ends. Regarding this, the plurality of guide walls 3 are provided in a manner so that the distance (distance between the broad width portion 32 on the bus bar 51 side and the end portion of the narrow width portion 31 on the bus bar 51 side) between the end portions located on both ends on the bus bar 51 side is greater than the distance (distance between the broad width portions 32 on the housing 6 side) between the end portions located on both ends on the housing 6 side. Furthermore, the broad width portions 32 of the guide walls 3 on the bus bar 51 side are each disposed located on an extension line of their corresponding partition plate in a plan view.

The electrical wires 102 inserted from the insertion holes 63 of the housing 6 are guided in the insertion direction, i.e., toward the bus bars 51, by the guide walls 3 as they pass through the inside of the housing 6. Thus, the electrical wires 102 inserted from the insertion holes 63 of the housing 6 are disposed in the insertion spaces formed by adjacent guide walls 3. As described above, regarding the narrow width portion 31 of the guide walls 3, the distance (distance between surfaces) between the side surfaces of adjacent narrow width portions 31 increases from the housing 6 side to the bus bar 51 side. By the inserted electrical wires 102 passing through the insertion spaces formed by adjacent guide walls 3, the electrical wires 102 can be routed with the electrical wires 102 separating as they extend from the housing 6 side toward the bus bar 51 side in a fan-like manner.

The broad width portion 32 on the bus bar 51 side of the guide wall 3 is provided on an extension line of the partition plate 24 corresponding to the guide wall 3. This allows the electrical wires 102 passing through the insertion spaces formed by the guide walls 3 to be guided to the end portions (fastening portions) of the bus bars 51 provided to the side of the partition plates 24 of the corresponding guide walls 3.

A positive electrode and negative electrode pair of the electrical wires 102 connected to the same in-vehicle load 101 are provided running through each insertion space. The pair of electrical wires 102 disposed in the same insertion space are guided by the guide walls 3 forming the insertion space and fastened to the end portion (fastening portion) of the corresponding positive electrode and negative electrode bus bar 51. The end portion (fastening portion) of the corresponding positive electrode and negative electrode bus bar 51 is partitioned and formed into its own section by the same partition plate 24, and the broad width portion 32 of the guide wall 3 on the bus bar 51 side, i.e., the end portion of the guide wall 3 on the bus bar 51 side, that forms the insertion space for disposing the pair of electrical wires 102 that are fastened to the end portions (fastening portions) of the bus bars 51 is located on an extension line of the partition plate 24 in a plan view.

Accordingly, the pair of electrical wires 102 that are guided by the guide walls 3 and pass through the broad width portion 32 on the bus bar 51 side (end portion on the bus bar 51 side) can be further guided toward the end portions (fastening portions) of the bus bars 51 partitioned by the partition plates 24 corresponding to the guide walls 3. This allows the LA terminals 103 provided on the pair of electrical wires 102 and the end portions (fastening portions) of the corresponding bus bars 51 to be fastened together efficiently.

Figure 8:
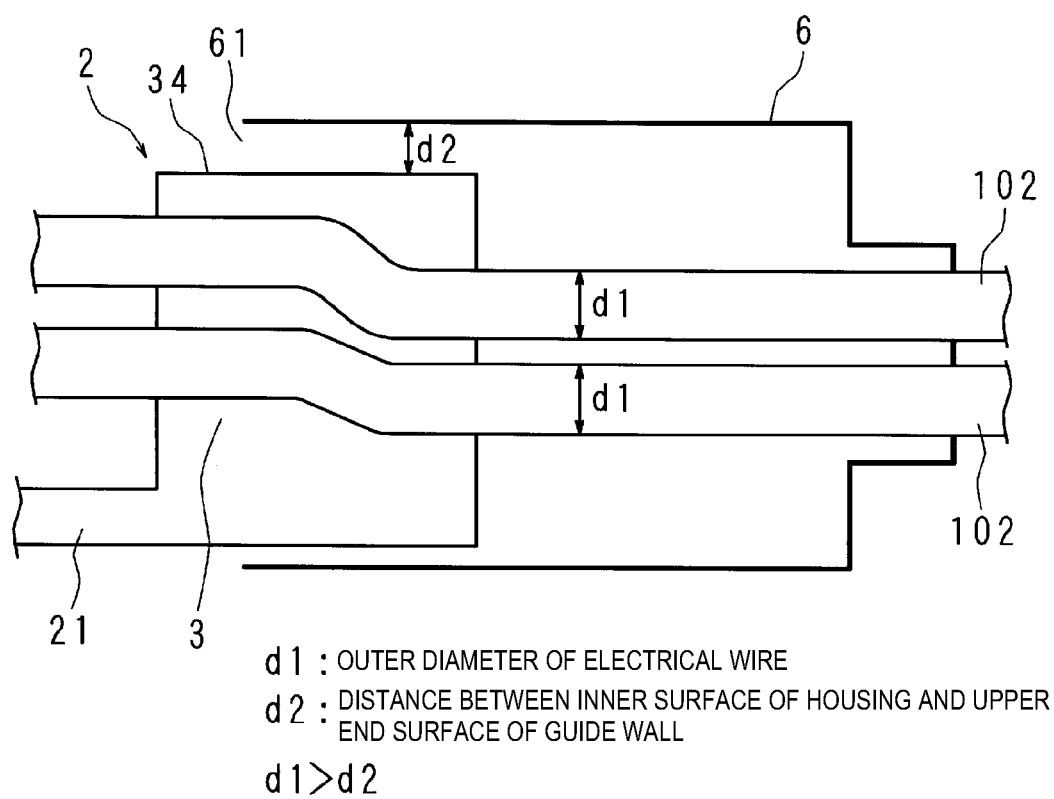
FIG. 8 is an explanatory diagram schematically illustrating the distance between an upper end surface of a guide wall and an inner surface of a housing.

FIG. 7 is a cross-sectional view taken along line A-A of FIG. 3. FIG. 8 is an explanatory diagram schematically illustrating the distance between the upper end surface 34 of the guide wall 3 and the inner surface of the housing 6.

As illustrated in FIG. 7, the electrical wires 102 inserted from the insertion holes 63 formed in the projection portion 62 first pass inside the housing 6 and to the side of the side surface (insertion space) of the guide wall 3, and are then fastened to the bus bars 51 located to the side of the side surface of the partition plate 24. The electrical wires 102 illustrated in FIG. 7 correspond to a positive electrode and a negative electrode pair of electrical wires 102 connected to the same in-vehicle load 101, and the LA terminals 103 provided on the pair of electrical wires 102 are fastened to the positive electrode and the negative electrode bus bar 51. The positive electrode and the negative electrode bus bar 51 are provided on the support 23 with a step-like shape, and the bus bars 51 provided on the upper level of the support 23, for example, are the positive electrode bus bars 51 and the bus bars 51 provided on the lower level of the support 23 are the negative electrode bus bars 51.

The housing 6 is provided with the opening portion 61 facing the terminal block 2 so as to cover the terminal block 2 from the side where the guide walls 3 are provided. Thus, a portion of the guide walls 3 is covered by the housing 6. In a cross-sectional view, the terminal block 2 is covered by the housing 6 in a manner so that the opening portion 61 of the housing 6 is located more to the end portion on the bus bar 51 side than the central portion of the guide walls 3. In other words, the guide walls 3 are covered by the housing 6 from the end portion of the guide walls 3 on the housing 6 side to the central portion, and a portion (the central portion from the end portion on the housing 6 side) of the guide walls 3 are stored inside the housing 6.

By a portion of the guide walls 3 being covered by the housing 6 in this manner, a portion of the upper end surface 34 of the guide walls 3 and the inner surface of the housing 6 are positioned facing one another. As illustrated in FIG. 8, a portion of the upper end surface 34 of the guide walls 3 and the inner surface of the housing 6 are positioned facing one another with a distance (distance between surfaces d2) between the upper end surface 34 and the inner surface of the housing 6 being less than an outer diameter (d1) of the electrical wires 102 (d1>d2).

The distance (d2) between the upper end surface 34 and the inner surface of the housing 6 is less than the outer diameter (d1) of the electrical wires 102. Accordingly, the electrical wires 102 that pass through the inside of the housing 6 and are inserted into the insertion space formed by one of the guide walls 3 can be reliably prevented from running up and over the upper end surface 34 of the guide wall 3 and entering the insertion space formed by another guide wall 3 before entering its insertion space.

The embodiments disclosed herein are examples in all respects and should not be interpreted as limiting in any manner. The scope of the present invention is defined not by the foregoing description, but by the scope of the claims, and all modifications that are equivalent to or within the scope of the claims are included.

The invention claimed is:

1. An electrical connection box capable of being installed in a vehicle, comprising:
    a terminal block;
    a bus bar provided on the terminal block; and
    a housing that covers at least a portion of the terminal block and into which a plurality of electrical wires configured to be connected to the bus bar are inserted, wherein
    the terminal block is provided with a plurality of guide walls that guide the plurality of electrical wires toward the bus bar,
    the plurality of guide walls are disposed side by side extending from the housing side toward the bus bar side, and
    a distance from any one guide wall to an other guide wall on the bus bar side is greater than a distance from the any one guide wall to the other guide wall on the housing side.

2. The electrical connection box according to claim 1, wherein
    the plurality of guide walls each have a linear shape, and
    a distance between surfaces of any two adjacent guide walls increases from the housing side toward the bus bar side.

3. The electrical connection box according to claim 1, wherein the plurality of guide walls includes a guide wall with a linear shape and a guide wall with a curved shape.

4. The electrical connection box according to claim 1, wherein one or more guide walls of the plurality of guide walls includes a narrow width portion and a broad width portion with a plate thickness greater than the narrow width portion, and
    the broad width portion is provided on an end portion on the housing side.

5. The electrical connection box according to claim 4, wherein the broad width portion is provided with a recess portion.

6. The electrical connection box according to claim 1, wherein a distance between an inner surface of the housing and an upper end surface of a guide wall facing the inner surface is less than an outer diameter of the plurality of electrical wires.

7. The electrical connection box according to claim 1, wherein the terminal block is provided with a plurality of partition plates that extend in a linear manner,
    the plurality of partition plates are located between the bus bars where the plurality of electrical wires are connected, and
    end portions on the bus bar side of the guide walls corresponding to the plurality of partition plates are located on extension lines in an extension direction of the partition plates.

8. The electrical connection box according to claim 1, wherein the plurality of electrical wires are configured to connect an electrical energy storage device capable of being installed in the vehicle and a plurality of in-vehicle loads connected in parallel,
    an insertion space where the plurality of electrical wires are inserted is formed between an adjacent pair of guide walls, and
    a positive electrode and a negative electrode pair of electrical wires configured to be connected to the same in-vehicle load are inserted into the insertion space.

9. The electrical connection box according to claim 8, wherein the electrical energy storage device is a high voltage battery, and
    the bus bar is a bus bar for high voltage.

* * * * *